United States Patent [19]
Calvani et al.

[11] Patent Number: 5,548,603
[45] Date of Patent: Aug. 20, 1996

[54] METHOD FOR THE GENERATION OF ULTRA-SHORT OPTICAL PULSES

[75] Inventors: Riccardo Calvani, Pino Torinese; Renato Caponi, Turin; Francesco Cisternino, Turin; Diego Roccato, Turin, all of Italy

[73] Assignee: Cselt-Centro Studi E Laboratori Telecomunicazioni S.P.A., Turin, Italy

[21] Appl. No.: 362,153

[22] Filed: Dec. 22, 1994

[30] Foreign Application Priority Data

Feb. 22, 1994 [IT] Italy .................... TO94A0104

[51] Int. Cl.$^6$ ............................ H01S 3/10
[52] U.S. Cl. ................ 372/25; 372/34; 372/20
[58] Field of Search .................. 372/25, 34, 20

[56] References Cited

U.S. PATENT DOCUMENTS

| | | | |
|---|---|---|---|
| 5,095,487 | 3/1992 | Meyerhofer et al. | 372/25 |
| 5,212,698 | 5/1993 | Kafka et al. | 372/25 |
| 5,400,350 | 3/1995 | Galvanauskas | 372/25 |

FOREIGN PATENT DOCUMENTS

| | | |
|---|---|---|
| 0431840A2 | 6/1991 | European Pat. Off. . |
| 3-102311 | 4/1991 | Japan . |

OTHER PUBLICATIONS

L'onde Electrique, vol. 73, No. 2, Mar. 1993, Paris, FR. pp. 69–75, XP 000360793, E. Brun et al Sources Lasers a Semiconducteurs Pour Systemes de Transmission Soliton sur Fibres Optiques.

Electronics Letters, vol. 27, No. 21, 10 Oct. 91, Stevenage, GB, K. Iwatsuiki et al International Journal of Electronics, vol. 60, No. 1, Jan. 1986, London, GB pp. 23–45, D. Bimberg et al.

IEEE Ptotonics Technology Letters, vol. 4, No. 1, 1 Jan. 92, New York, US, P. A. Andrekson et al 32 Gb/s Optical Solition Data Transmission Over 90 km.

Generation of an Extremely Short Single Mode Pulse (2 PS) by Fiber Compression of a Gain–Switched Pulse from a 1.3μm Distributed–Feedback Laser Diode, Applied Physics Letters 59 (11), 9 Sep. 1991, by H. F. Liu et al.

Nearly Transform–Limited (3–6 PS) Generation From Gain–Switched 1.55 μm Distributed Feedback Laser By Using Fibre Compression Technique, Electronics Letters, vol. 29, No. 1, 7, Jan. 1993, by K. A. Ahmed et al.

Subpicosecond Solition Compression of Gain Switched Diode Laser Pulses Using an Erbium–Doped Fiber Amplifier, IEEE Journal of Quantum Electronics, vol. 29, No. 6, Jun. 1993, by J. T. Ong et al.

*Primary Examiner*—Léon Scott, Jr.
*Attorney, Agent, or Firm*—Herbert Dubno

[57] ABSTRACT

Ultra-short transform-limited optical pulses, to be utilized for high bit-rate transmission systems, are obtained through direct modulation of a semiconductor laser by pulses of such duration as to excite only the first peak of the relaxation oscillations of the cavity of laser, tuned to such a length that the pulse portions that overlap inside the cavity interfere constructively. The pulses emitted by the laser then pass upon a fiber with high negative dispersion to compensate for the phase effect due to the chirp.

8 Claims, 2 Drawing Sheets

METHOD FOR THE GENERATION OF ULTRA-SHORT OPTICAL PULSES

FIELD OF THE INVENTION

The invention described herein relates to optical Fiber communications systems and, more particularly, to a method for the generation of ultra-short optical pulses to be utilized for high bit rate transmission systems.

BACKGROUND OF THE INVENTION

Optical communications systems at very high bit rates (typically from 10 to 100 Gbit/s and more) are currently being studied. In these systems, a plurality of channels are transmitted, and each of them conveys information represented by a succession of 0 and 1 pulses. The pulses of a channel are transmitted at a relatively low bit rate (up to 10 Gbit/s) and between two successive pulses of a channel there are inserted, in a pre-determined sequence, the pulses relating to the other channels, transmitted at the same rate. This multiplexing method, well known from electronic signal technique, is named in the case at hand "Optical Time Division Multiplexing", commonly known with the acronym OTDM.

It is evident that, to fully exploit the capacity of the transmission medium with the method described, it is desirable that the pulses be as narrow as possible in order to avoid interference between the channels and to allow the correct demultiplexing at the receiving side. Actually, at those rates, demultiplexing must be performed completely optically. Some of the techniques proposed for this purpose, which exploit the so-called Four Wave Mixing (FWM) or the Kerr effect in optical Fibers (Nonlinear Optical Loop Mirror, NOLM) and are based on the overlapping between the pulse of the channel to be extracted and a pump pulse within that Fiber (which acts as a nonlinear medium), require that the two pulses remain overlapping as long as possible during the travel along the Fiber. Furthermore the pulses must have such shape and band characteristics that the pulses themselves propagate with as little distortion as possible. This requirement is generally expressed by saying that the pulses must be "transform limited", this expression meaning that the product between the duration or full width at half maximum (FWHM) $\Delta t$ and the bandwidth $\Delta v$ must have a certain value, corresponding to the theoretical minimum, which depends on the pulse shape. In particular, since the pulses that are most commonly used and that have yielded the best results in transmission are Gaussian and hyperbolic secant pulses, the term "transform limited" is used to indicate pulses where the product $\Delta t \cdot \Delta v$ takes a value that corresponds or is close to that of the Gaussian pulse or the hyperbolic secant pulse (0.441 and respectively 0.314).

To generate pulses with these characteristics, it has been proposed to utilize the direct modulation of a semiconductor laser by means of pulses of such duration as to excite only the first peak of the laser relaxation oscillations (gain switching technique). In that condition the pulses emitted by the laser exhibit, because of the modulation, a high chirp and therefore, before being utilized, they are made to propagate in an optical Fiber with such dispersion characteristics as to compensate the phase distortion produced by said chirp. This technique of generating ultrashort, transform-limited optical pulses is described for example by H. F. Liu et al. in "Generation of an extremely short singlemode pulse (2 ps) by Fiber compression of a gain-switched pulse from a 1.3 µm distributed feedback laser diode", Applied Physics Letters 59 (11), 9 Sep. 1991, by K. A. Ahmed et al. in "Nearly transform-limited (3–6 ps) generation from gain-switched 1.55 µm distributed feedback laser by using Fiber compression technique", Electronics Letters, vol. 29, no. 1, 7 January 1993, or yet by J. T. Ong et al. in "Subpicosecond Soliton Compression of Gain-Switched Diode Laser Pulses Using an Erbium-Doped Fiber Amplifier", IEEE Journal of Quantum Electronics, vol. 29, no. 6, Jun. 1993.

The system described in the first of the above articles generates a pulse that yields a product $\Delta t \cdot \Delta v$ within the desired range, but utilizes a source whose wavelength (1.3 µm) does not coincide with the null-dispersion wavelength (~1.55 µm) of the Fibers utilized in the optical demultiplexing systems proposed until now; moreover, the pulse is strongly affected by noise and it has a shape (Lorentzian pulse) that is not normally exploited for information transmission. The methods described in the second and third articles utilize sources at a wavelength of 1.55 µm, as required for the subsequent demultiplexing, but originate pulses whose product $\Delta t \cdot \Delta v$ is very far from the desired interval.

SUMMARY OF THE INVENTION

According to the invention, a method is instead provided, which, thanks to the introduction of an additional control parameter on the shape of the pulses, giving pulses at the wavelength required for the subsequent demultiplexing with a product $\Delta t \cdot \Delta v$ within the required range.

The invention provides a method wherein, through direct modulation of a semiconductor laser, pulses corresponding to the first peak of the relaxation oscillations of the laser cavity are generated, which pulses have longer duration than their time of flight inside the cavity, so that in the latter there is an overlap between pulse portions that correspond to the time of flight. Such pulses are caused to pass inside a Fiber with high negative dispersion to compensate the phase effect due to the chirp and the length of the laser cavity is thermally tuned to a value such that the pulse portions that overlap inside the cavity are associated to with fields that interfere so as to enhance the central peak and minimize the influence of the queues.

This length corresponds to a condition where there is a pure autocorrelation with minimum duration.

The invention originated from the daily observation of the behavior of the source, which has led to the conclusion that ambient temperature influenced its pulse emission characteristics. A more in-depth study has in fact demonstrated that the autocorrelation traces of the pulses coming out of the compensation Fiber show a periodic behavior as the laser temperature varies and in particular that pulses are periodically obtained whose characteristics of duration and shape are particularly satisfactory. The pulse duration is longer than the time of flight inside the laser cavity, so that the signal emitted by the laser results from the overlapping between different portions of a pulse. We consider that this periodic behavior was due to different interference conditions between the various pulse portions due to the variation of the length of the cavity with temperature, and thus temperature control has been exploited to bring the laser to operate in one of the conditions where the pulse has minimal duration, particularly in the condition closest to the normal optimal working conditions.

According to another aspect of the invention, an optical communications system at high bit rate is also provided, in which a plurality of channels is transmitted, to each of them being associated an information item represented by a succession of ultra-short optical pulses repeating themselves at relatively low bit rate with respect to the overall bit rate, and a completely optical demultiplexing is carried out, based on the overlapping between a pump pulse and the pulse of a channel to be extracted inside an optical Fiber acting as a non linear medium, and in which the ultra-short pulses to be transmitted and the pump pulse are generated with a method as defined above.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
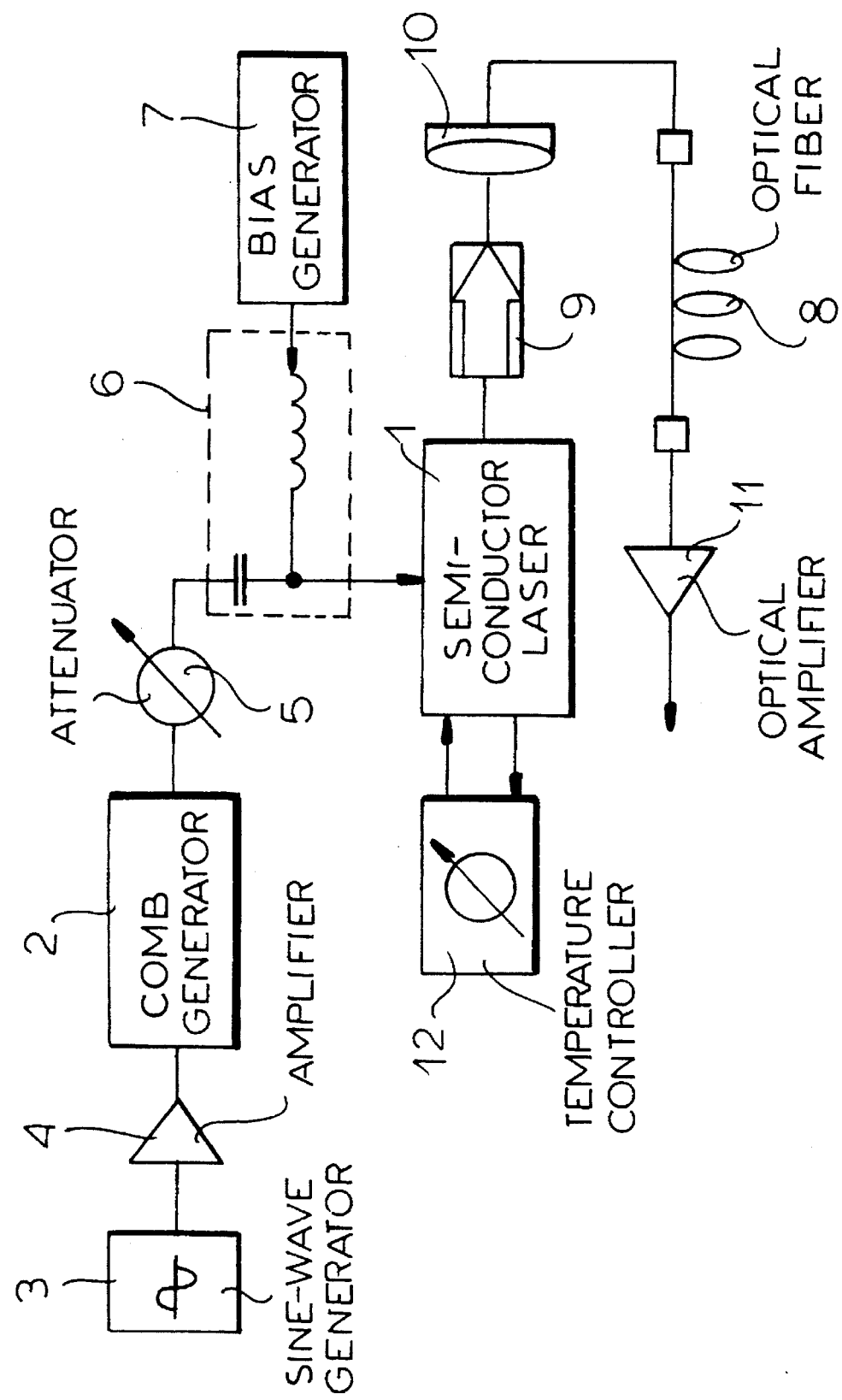
FIG. 1 is a layout of an apparatus for the realization of the method according to the invention.

The apparatus shown in FIG. 1 is as described in the literature for the generation of ultrashort and transform limited pulses. The path of the electrical signals is shown with thick lines and the paths of the optical signals with thin lines. A semiconductor laser 1 is brought to operate in gain-switching conditions by electrical pulses of suitable frequency (e.g. between about a hundred MHz and a few GHz) emitted by a comb generator 2 driven by a generator 3 of sinusoidal signals through an amplifier 4. The pulses are provided to the laser modulation input after having been attenuated by an attenuator 5 and added, in an LC circuit 6, to a bias current provided by a generator 7 and having such a value that laser 1 is kept well below the stimulated emission threshold. Advantageously, the laser is a distributed-feedback laser, because such a type of laser, in addition to having emission wavelengths within the range normally used for optical transmissions and in particular the wavelengths required by completely optical demultiplexing systems, has the best single-mode characteristics. Through a suitable optical system surrounded by insulator 9 (which avoids reflections inside the cavity) and by lens 10, the pulses emitted by laser 1 are sent into a span of optical Fiber 8 with high negative dispersion (for example a dispersion of between roughly −60 and −70 ps/nm/Km), of characteristics complementary to those due to the effect of phase distortion produced by the chirp, and of such a length as to compensate the aforementioned effect. The pulses leaving Fiber 8 are sent to an optical amplifier 11 and then to the utilization devices (e.g. an electro-optical modulator if the pulses are utilized as transmission carrier, or the Fiber of an optical demultiplexer, if the pulse is utilized as a pump signal for optical demultiplexing).

As stated in the discussion of the prior art, the pulses obtained at the output of Fibers 8 do not exhibit satisfactory characteristics in terms of product $\Delta t \cdot \Delta v$. Therefore, according to the invention, a further correction of the width and shape of the pulse is performed, by acting upon the working temperature of the laser and thus on the optical length of the cavity.

More particularly, in an equipment calibration phase, the working temperature is set to such a value that there are favorable conditions of interference between the various pulse portions corresponding to the time of flight inside the laser cavity, i.e. conditions in which the central peak is accentuated and the influence of the queues is minimized. The attainment of these conditions is detected by means of a self-correlator and a low frequency oscilloscope, both connected to the output of amplifier 11. For temperature adjustment, the conventional temperature control devices 12, with which all lasers are equipped, can be used. In this way, employing the invention does not require modifications of the source or the presence of additional equipment. A sufficiently fine adjustment (e.g. by steps of 1/10 of a degree or even less) can be obtained with a device comprising a Peltier-effect cell and a thermistor.

In general, considering by way of example a Gaussian pulse, the optical field and intensity related to the pulse and to its first two foldings due to the reflections within the cavity, turn out to be respectively:

$$E(t) = E_0 \{ e^{-\frac{t^2}{T^2}} \cdot e^{i\omega_0 t} + k \cdot e^{-\frac{(t+\tau)^2}{T^2}} \cdot e^{i\omega_0(t+\tau)} + k^2 \cdot e^{-\frac{(t+2\tau)^2}{T^2}} \cdot e^{i\omega_0(t+2\tau)} \} \quad (1)$$

$$I(t) = I_0 \{ e^{-2\frac{t^2}{T^2}} + k^2 \cdot e^{-2\frac{(t+\tau)^2}{T^2}} + k^4 \cdot e^{-2\frac{(t+2\tau)^2}{T^2}} + 2k[e^{-\frac{t^2+(t+\tau)^2}{T^2}} + k^2 \cdot e^{-\frac{(t+\tau)^2+(t+2\tau)^2}{T^2}}]\cos(\omega_0\tau) + 2k^2 \cdot e^{-\frac{t^2+(t+2\tau)^2}{T^2}} \cdot \cos(2\omega_0\tau) \} \quad (2)$$

and the related autocorrelation function is given, as is well known, by $$A(t) = \int_{-\infty}^{+\infty} I(t+t') \cdot I(t')dt' \quad (3)$$

In (1) and (2), $\omega_O$ is the emission frequency of the laser, $\tau$ is the complete time of flight inside the cavity, T is the pulse duration and k is a phenomenological constant that takes into account the reflectivity and the residual gain of the cavity (as the pulse duration is longer than the time of flight inside the cavity, the cavity can be deemed to be still active when inside it the pulse undergoes the successive foldings spaced respectively by one and two times of flight). From relations (1) and (2), the skilled works in the art is perfectly able to determine, given the duration of the pulses applied to laser 1 and the characteristics of the laser itself, the values of temperature where the most favorable interference between the various overlapping pulse portions is obtained, i.e. a pure autocorrelation profile condition with minimal duration. Among the various values that satisfy this condition, one will choose a value close to the working temperature considered optimal for the normal use of the laser, in particular the closest one.

Figure 2:
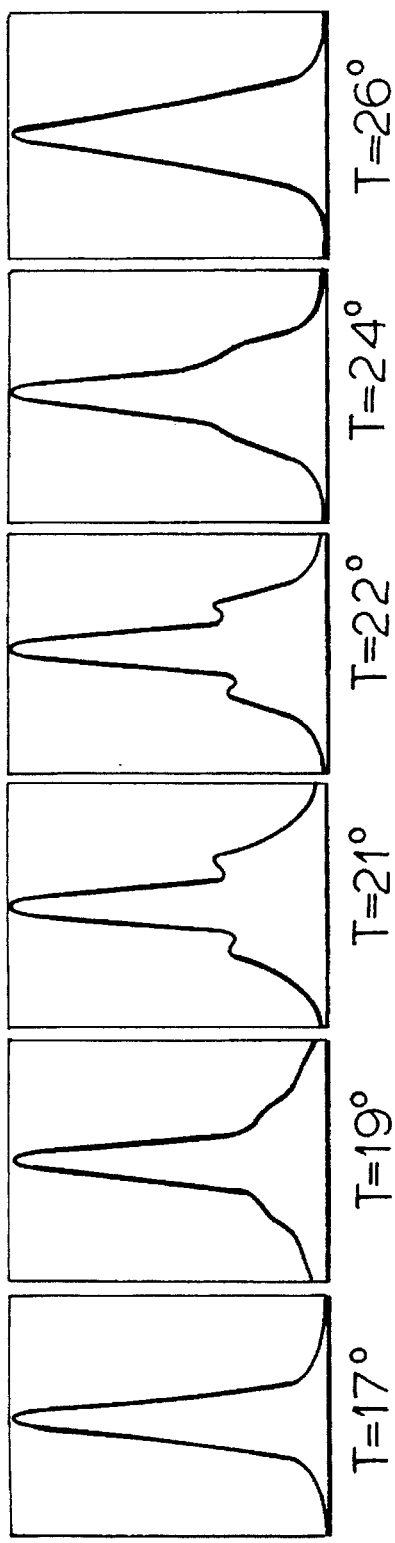
FIG. 2 shows the autocorrelation traces, obtained experimentally, of the pulses generated with the apparatus of FIG. 1 as the temperature varied.

FIG. 2 shows the autocorrelation traces obtained at the output of amplifier 11, as the temperature of the laser varies, in an experiment where: source 1 was a distributed feedback, single mode laser operating at 1548 nm and having a modulation band of 10 GHz; the pulses emitted by comb generator 2 had a duration of 70 ps and a nominal peak voltage of 15 V; Fiber span 8, about 300 m long, had a dispersion, at 1548 nm, of −68 ps/nm/Km. When the temperature of laser 1 was made to vary from 8° C. to 35° C., traces were obtained that repeated themselves with a periodicity essentially equal to 9° C. The traces are reported only for the temperature interval 17° C.–26° C., i.e. for the interval defined by the two consecutive pulses of optimal shape that were the closest to the normal working temperature (about 20° C). In particular, the pulse at 17° C. displayed a duration of 3.46 ps and a product $\Delta t \cdot \Delta v$ of 0.39, thus rather close to the value required for Gaussian transform-limited pulses.

Figure 3:
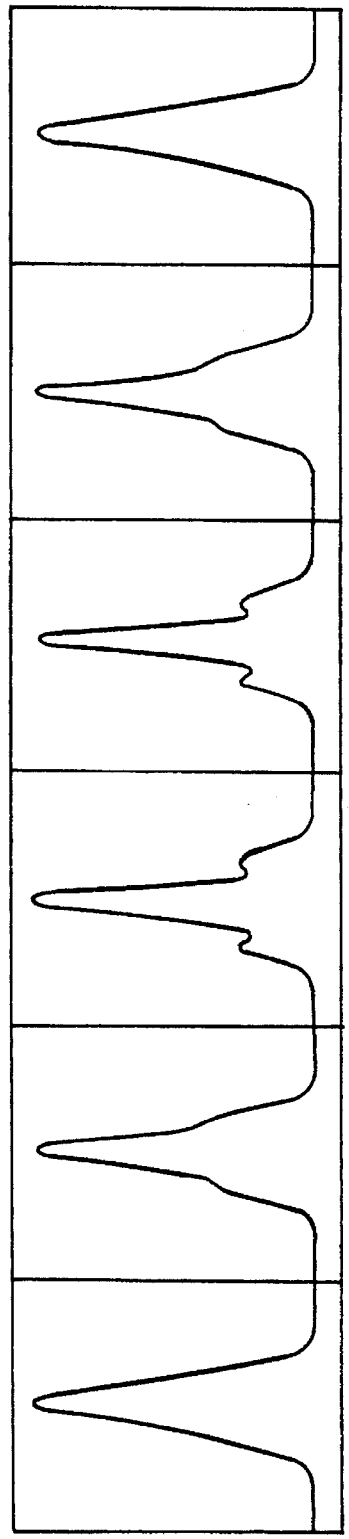
FIG. 3 shows the corresponding theoretical autocorrelation traces in the case of a Gaussian pulse.

The comparison with FIG. 3, which illustrates the corresponding simulated autocorrelation traces obtained in the case of Gaussian pulse (i.e. according to the relations given above), by utilizing the same values of the parameters as utilized in the actual experiment, shows that the practical results are in good qualitative accord with the theoretical ones.

We claim:

1. A method of generating ultrashort optical pulses, comprising the steps of:

(A) generating in a laser cavity of a semiconductor laser, laser pulses corresponding to a first peak of relaxation oscillations of said laser cavity and with a longer duration than a time of flight of the laser pulses inside said cavity so that within said cavity there is an overlapping between different overlapping pulse portions, each of said overlapping pulse portions corresponding to a time of flight;

(B) passing said laser pulse from said laser cavity through an optical Fiber with high negative dispersion to compensate for a phase effect chirping produced in said laser; and (C) thermally tuning an optical length of said laser cavity to a value such that said overlapping pulse portions have fields that interfere in a manner enhancing a central peak of a selected pulse and minimizing remaining pulse queues thereof.

2. The method defined in claim 1 wherein said optical length of the laser cavity is thermally tuned to a value, selected from values of said optical length creating interference in a manner enhancing the central peak of the respective pulse and minimizing the queues thereof, which is closest to an optimal working temperature of the laser.

3. The method defined in claim 2 wherein the thermal tuning of the optical length of the laser cavity is carried out by operating a temperature control device of the laser in a calibration phase of pulse generation thereof.

4. The method defined in claim 1 wherein the thermal tuning of the optical length of the laser cavity is carried out by operating a temperature control device of the laser in a calibration phase of pulse generation thereof.

5. A high bit-rate optical communication system comprising:

a semiconductor laser having a laser cavity wherein laser pulses are generated corresponding to a first peak of relaxation oscillations of said laser cavity and with a longer duration than a time of flight of the laser pulses inside said cavity so that within said cavity there is an overlapping between different overlapping pulse portions, each of said overlapping pulse portions corresponding to a time of flight;

an optical Fiber with high negative dispersion connected to said laser cavity and receiving said laser pulses therefrom and passing said laser pulses to compensate for a phase effect due to chirp chirping pranced in said laser and output ultrashort communications pulses; and means for thermally tuning an optical length of said laser cavity to a value such that said overlapping pulse portions have fields that interfere in a manner enhancing a central peak of a selected laser pulse and minimizing remaining pulse queues thereof in the outputted ultrashort communications pulses.

6. The system defined in claim 5 wherein said optical length of the laser cavity is thermally tuned to a value, selected from values of said optical length generating interference in a manner enhancing the central peak of the respective pulse and minimizing the queues thereof, which is closest to an optimal working temperature of the laser.

7. The system defined in claim 6 wherein the thermal tuning of the optical length of the laser cavity is carried out with a temperature control device provided for the laser in a calibration phase of pulse generation thereof.

8. The system defined in claim 5 wherein the thermal tuning of the optical length of the laser cavity is carried out with a temperature control device provided for the laser in a calibration phase of pulse generation thereof.

\* \* \* \* \*